(12) United States Patent
Dicker

(10) Patent No.: US 8,652,710 B2
(45) Date of Patent: Feb. 18, 2014

(54) DEVICE MANUFACTURING METHOD, METHOD OF MAKING A MASK, AND MASK

(75) Inventor: Gerald Dicker, Tillburg (NL)

(73) Assignee: ASML Netherlands B.V., Veldhoven (NL)

( * ) Notice: Subject to any disclaimer, the term of this patent is extended or adjusted under 35 U.S.C. 154(b) by 1268 days.

(21) Appl. No.: 11/802,923

(22) Filed: May 25, 2007

(65) Prior Publication Data

US 2008/0292975 A1 Nov. 27, 2008

(51) Int. Cl.
*G03F 1/14* (2006.01)

(52) U.S. Cl.
USPC .............................................. 430/5; 430/322

(58) Field of Classification Search
USPC ....................................... 430/5, 322
See application file for complete search history.

(56) References Cited

U.S. PATENT DOCUMENTS

| | | | |
|---|---|---|---|
| 5,707,765 A * | 1/1998 | Chen | 430/5 |
| 6,541,167 B2 * | 4/2003 | Petersen et al. | 430/5 |
| 2006/0246362 A1 | 11/2006 | Yasuzato | |
| 2007/0002300 A1 * | 1/2007 | Hansen et al. | 355/67 |

FOREIGN PATENT DOCUMENTS

| | | |
|---|---|---|
| EP | 1152288 | 11/2001 |
| EP | 1235103 | 8/2002 |
| EP | 1530084 | 5/2005 |
| JP | 2001-358070 | 12/2001 |
| JP | 2002-351051 | 12/2002 |
| JP | 2005-141242 | 6/2005 |
| JP | 2005-340493 | 12/2005 |
| JP | 2005-340553 | 12/2005 |
| JP | 2006-309039 | 11/2006 |
| JP | 2007-065246 | 3/2007 |
| JP | 2008-116862 | 5/2008 |

OTHER PUBLICATIONS

Japanese Office Action mailed Nov. 2, 2010 in related Japanese patent application No. 2008-129058.

* cited by examiner

*Primary Examiner* — Deborah Chacko Davis
(74) *Attorney, Agent, or Firm* — Pillsbury Winthrop Shaw Pittman LLP

(57) ABSTRACT

In a lithographic device manufacturing method, sub-resolution assist features are provided to equalize the intensities of the diffraction orders that form the image of the pattern on the substrate. In the case of bright lines against a dark field used with a positive tone resist for forming trenches at or near resolution, the assist features may comprise narrow lines equidistantly between the feature lines. In this way an improvement of exposure latitude may be obtained without reduction of DOF.

20 Claims, 6 Drawing Sheets

DEVICE MANUFACTURING METHOD, METHOD OF MAKING A MASK, AND MASK

FIELD

The present invention relates to a method for manufacturing a device using a lithographic apparatus, to a method of making a mask for use in the method of manufacturing and to a mask usable in the method of manufacturing.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to improve imaging of mask patterns, it is well known to apply techniques such as mask-biasing (in which feature sizes are changed to pre-compensate for imaging errors), serifs (which are additions to pattern features to improve imaging of ends and corners), and optical proximity correction (OPC) (in which sub-resolution assist features of various types are added to compensate for diffraction effects due to the presence or absence of neighboring features). In particular, assist features are applied in the proximity of isolated or semi-isolated features to increase the depth of focus (DOF) of those features. However, improvements in DOF are made at the expense of exposure latitude (EL) so that a compromise between these figures of merit has to be made. In some cases, exposure latitude is sufficiently small that assist features cannot be used.

SUMMARY

It is desirable to provide a method of improving the imaging of patterns having a small exposure latitude and/or improving exposure latitude without detriment to DOF.

According to an aspect of the invention, there is provided a device manufacturing method comprising projecting an image of a mask pattern onto a substrate, wherein the mask pattern comprises pattern features having a first dimension and assist features having a second dimension, the second dimension being sufficiently smaller than the first dimension such that the assist features are not resolved in the projected image, and the assist features are arranged such that at least two diffraction orders that combine to form the projected image have substantially the same intensity.

According to an aspect of the invention, there is provided a method of making a mask pattern for use in lithography, the method comprising:
providing pattern features having a first dimension representing device features to be formed by lithography; and
providing assist features having a second dimension, the second dimension being sufficiently smaller than the first dimension such that the assist features are not resolved in the projected image, wherein the assist features are arranged such that when an image of the mask pattern is projected onto a substrate at least two diffraction orders that combine to form the image have substantially the same intensity.

According to an aspect of the invention, there is provided a mask pattern for use in lithography, the mask pattern comprising:
pattern features having a first dimension representing device features to be formed by lithography; and
assist features having a second dimension, the second dimension being sufficiently smaller than the first dimension such that the assist features are not resolved in the projected image, wherein the assist features are arranged such that when an image of the mask pattern is projected onto a substrate at least two diffraction orders that combine to form the image have substantially the same intensity.

According to an aspect of the invention, there is provided a device manufacturing method comprising:
providing a mask pattern, comprising pattern features and assist features; and
projecting an image of the mask pattern onto a layer of positive tone resist on a substrate,
wherein the pattern features and the assist features comprise bright features contrasting with a dark field, the assist features being lines arranged in one or two directions and positioned equidistantly between pairs of pattern features, and
the width of the assist features being selected such that the assist features are not resolved in the projected image and the peak intensities of at least two diffraction orders forming the projected image are substantially equal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
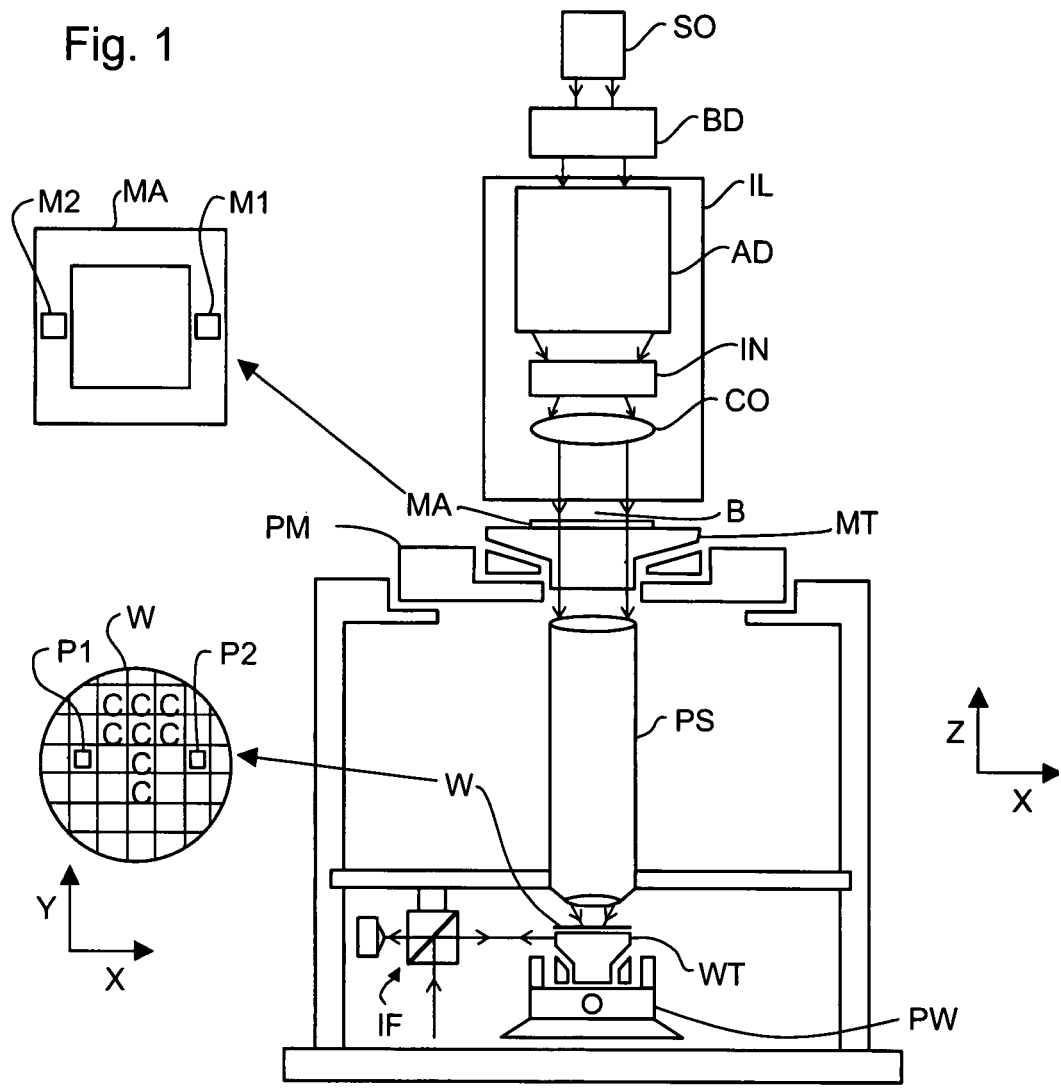
FIG. 1 depicts a lithographic apparatus that can be used in an embodiment of the invention.

FIG. 1 schematically depicts a lithographic apparatus that can be used in one or more methods according to the invention. The apparatus comprises:

- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structure may be used in parallel, or preparatory steps may be carried out on one or more tables and/or support structure while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned. by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1). can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
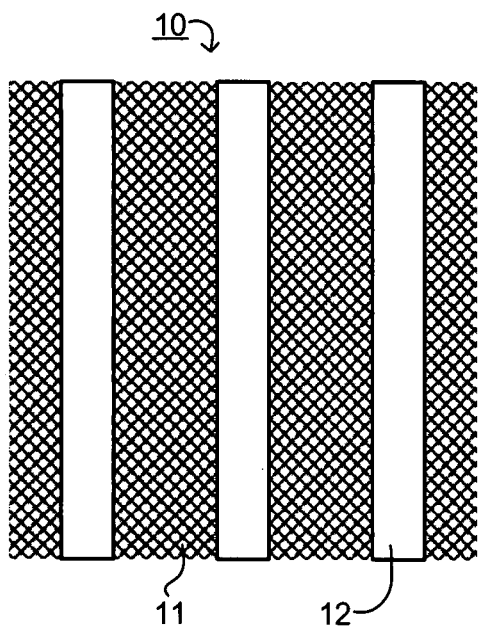
FIG. 2 depicts a part of a mask pattern according to a comparative example.
Figure 3:
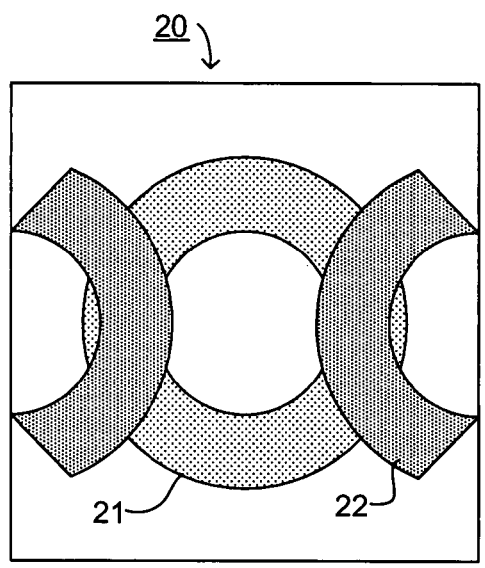
FIG. 3 depicts the diffraction orders in a pupil plane created by the mask pattern of FIG. 2.

FIG. 2 illustrates a part of a mask 10 used for at- or near-resolution imaging of trenches. It comprises bright lines 12, representing the trenches, against a dark field (background) 11 and is used with a positive tone resist. The dark field in this example has a transmission of 6.4%, phase shifted by 180°. The mask may be described as a 6.4%-attenuated PSM. Clearly, the transmission may be a different value (e.g., a value from between 5 to 20%) and the phase shift may be an odd multiple of 180°. Moreover, bright and dark may also be understood in the context of reflective masks and thus references to transmission and tranmissivity would be replaced by reflection and reflectivity. The width L1 of the lines is such that at substrate level it is the critical dimension in imaging of the pattern and is at or near the resolution limit of the apparatus to be used. When imaging such a pattern, the exposure latitude (EL) is low, e.g. between 8 and 9%, so that there is little or no room to improve depth of focus using conventional assist features. FIG. 3 shows the diffraction orders in a pupil plane 20 of the projection system PS generated by such a pattern when illuminated with off-axis illumination, in this example annular illumination. The zeroth order 21 and first orders 22 have different intensities (shown by the different shading), determined by the duty ratio—line width to pitch ratio—of the pattern. Since it is interference between these beams that recreates the image, a difference in intensity may result in incomplete interference and a significant DC component, hence the low exposure latitude.

Figure 4:
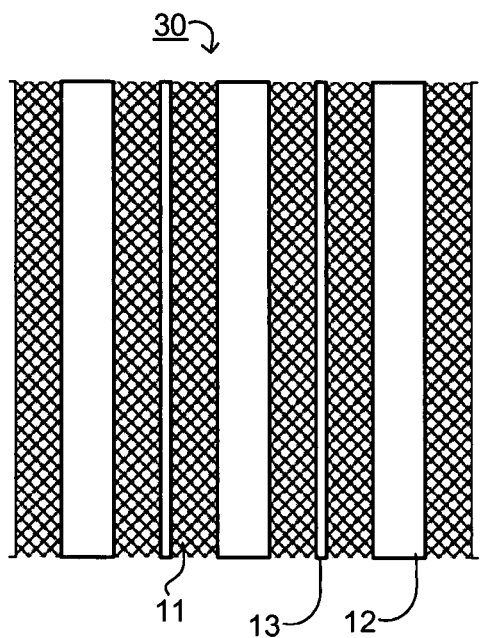
FIG. 4 depicts a part of a mask pattern according to an embodiment of the invention.
Figure 5:
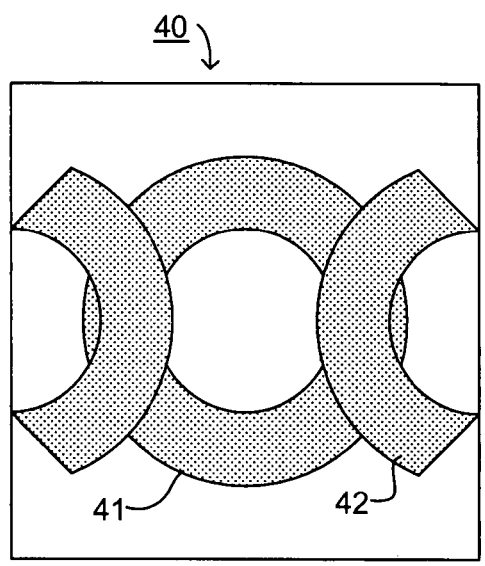
FIG. 5 depicts the diffraction orders in a pupil plane created by the mask pattern of FIG. 4.

Thus, according to an embodiment of the invention, in mask 30 shown in FIG. 4, a bright assist feature 13 is provided equidistant between each pair of lines 12. The scattering bar 13 has a width L2 that is much less than width L1, e.g. in the range of from 0% to 40% of L1 or in the range of from 10% to 30% of L1 or in the range of from 15% to 25% of L1, such that at substrate level the image of the assist feature 13 is less than the resolution of the apparatus used and it is not imaged in the developed resist. The width of the assist feature 13 is chosen to provide the desired exposure latitude gain by equalizing the intensity of the diffraction orders in the pupil plane of the projection system. The degree of equalization determines in part the amount of benefit provided and in an embodiment of the invention the intensities may differ by not more than 20%, by not more than 10%, or by not more than 5%. It is noted that the diffraction orders will not have a uniform intensity throughout their extent in the pupil plane so that by the intensity of a diffraction order is meant the average intensity. In an embodiment, the equalization may relate to the peak intensities of at least two diffraction orders forming the projected image. In the illustrated example, the diffraction orders whose intensities are to be equalized are the zeroth order and the two first orders. However, in another embodiment, the diffraction orders whose intensities are to be equalized may be the zeroth order and one of the first orders or the two first orders in one or two orthogonal directions.

The appropriate width for the assist feature 13 can be determined by simulation of different widths until a suitable effect is obtained, or from empirical rules determined by simulation, or from theoretical models, for example. In the illustrated example, assist feature 13 takes the form of a simple line but for other patterns other forms of assist feature may be appropriate.

Figure 6:
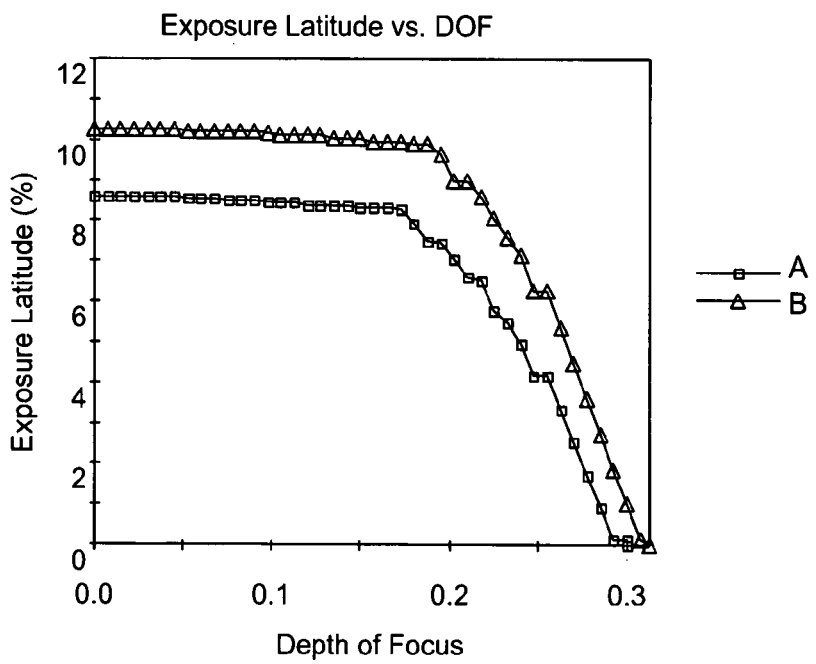
FIG. 6 is a graph of exposure latitude vs. depth of focus for a comparative example employing the mask of FIG. 2 and an embodiment of the invention employing the mask of FIG. 4.
Figure 7:
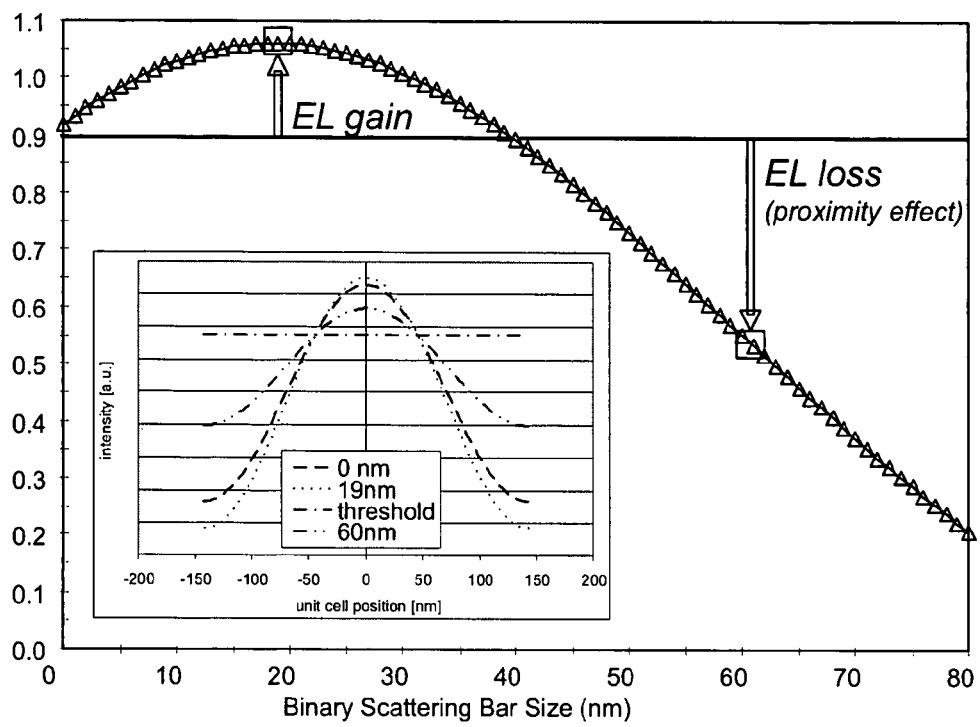
FIG. 7 is a graph of normalized intensity log-slope vs. width of an assist feature in an embodiment of the invention.

FIGS. 6 and 7 illustrate the effect of an embodiment of the invention in improving imaging of 96 nm lines on a dark field. In FIG. 6, which is a graph of exposure latitude vs. depth of focus, line A (squares) represents a comparative example of a simple array of lines of width 96 nm while line B (triangles) represents an embodiment of the invention having an elongate assist feature of width 19 nm between lines of 96 nm. It can be seen that there is a significant increase in exposure latitude over a wide range of depth of focus.

In FIG. 7, the effect of the line width of the assist feature on exposure latitude is shown. It will be seen that in this example—again of lines of 96 nm—maximum exposure latitude is obtained at an assist feature width of 19 nm, when the intensities of the diffraction orders are equalized. The inset shows the effect on the aerial image of assist features of width 0 nm, 19 nm and 60 nm relative to the resist threshold.

Figure 8:
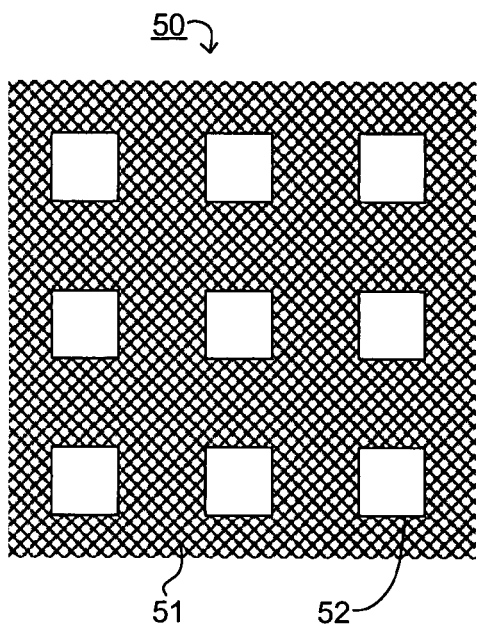
FIG. 8 depicts a part of a mask pattern according to another comparative example.
Figure 9:
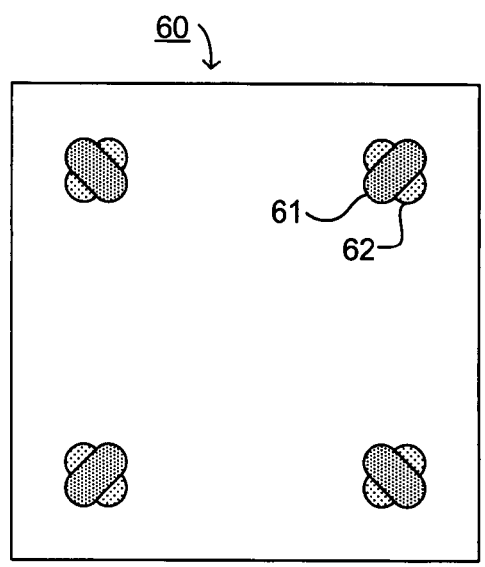
FIG. 9 depicts the diffraction orders in a pupil plane created by the mask pattern of FIG. 8.

FIG. 8 shows a mask 50 used for printing contact holes. The contact holes are represented in the mask as bright features 52 arranged in a rectangular array against a dark field, e.g. of 6.4% transmission with a 180° degree phase shift. FIG. 9 shows the intensity of the diffraction orders 61, 62 in the pupil plane of a projection system when this pattern is illuminated with an off-axis quadrupole mode optimized for the pattern. As can be seen, the beams of the zeroth order have a lower average intensity than the first order beams.

Figure 10:
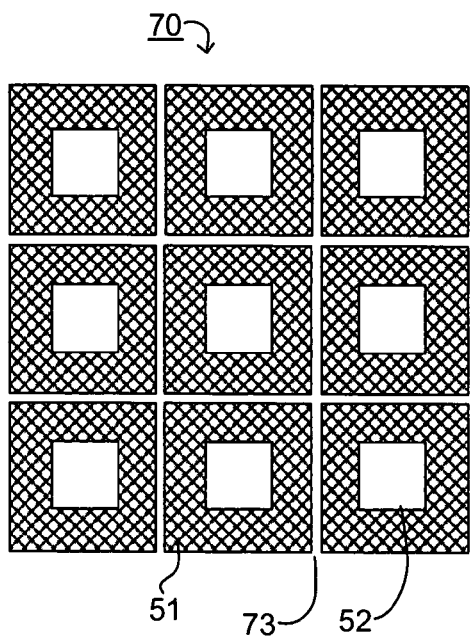
FIG. 10 depicts a part of a mask pattern according to another embodiment of the invention.
Figure 11:
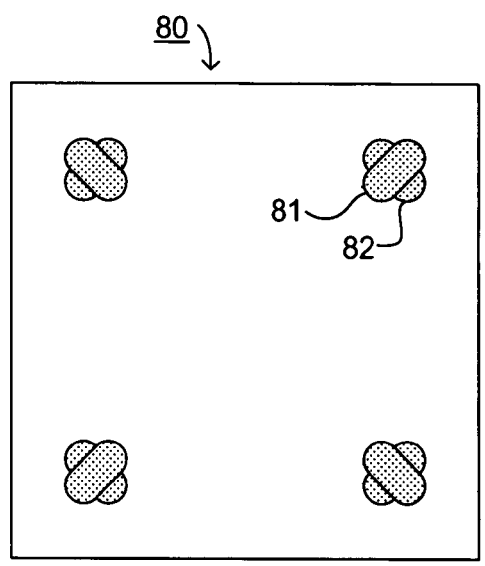
FIG. 11 depicts the diffraction orders in a pupil plane created by the mask pattern of FIG. 10.

In another embodiment of the invention, shown in FIG. 10, the mask 70 is provided with sub-resolution assist features 73 in addition to the bright features 52 corresponding to the contact holes. The assist features 73 comprise lines substantially parallel to the rows and columns of the array of contact holes and equidistant between the rows and columns. The assist features 73 have a width that is much less than the width of the bright features 53, e.g. in the range of from 0% to 30% of the width of the bright features or in the range of from 2% to 20% of the width of the bright features or in the range of from 5% to 15% of the width of the bright features, such that at substrate level the assist feature 73 is not resolved by the apparatus used in the sense that it is not imaged in the developed resist. As shown in FIG. 11, which shows intensity of the diffraction orders in the pupil plane when this pattern is illuminated with the same illumination mode as used for FIG. 9, the average intensity of the zeroth order is now substantially the same as that of the first order.

Figure 12:
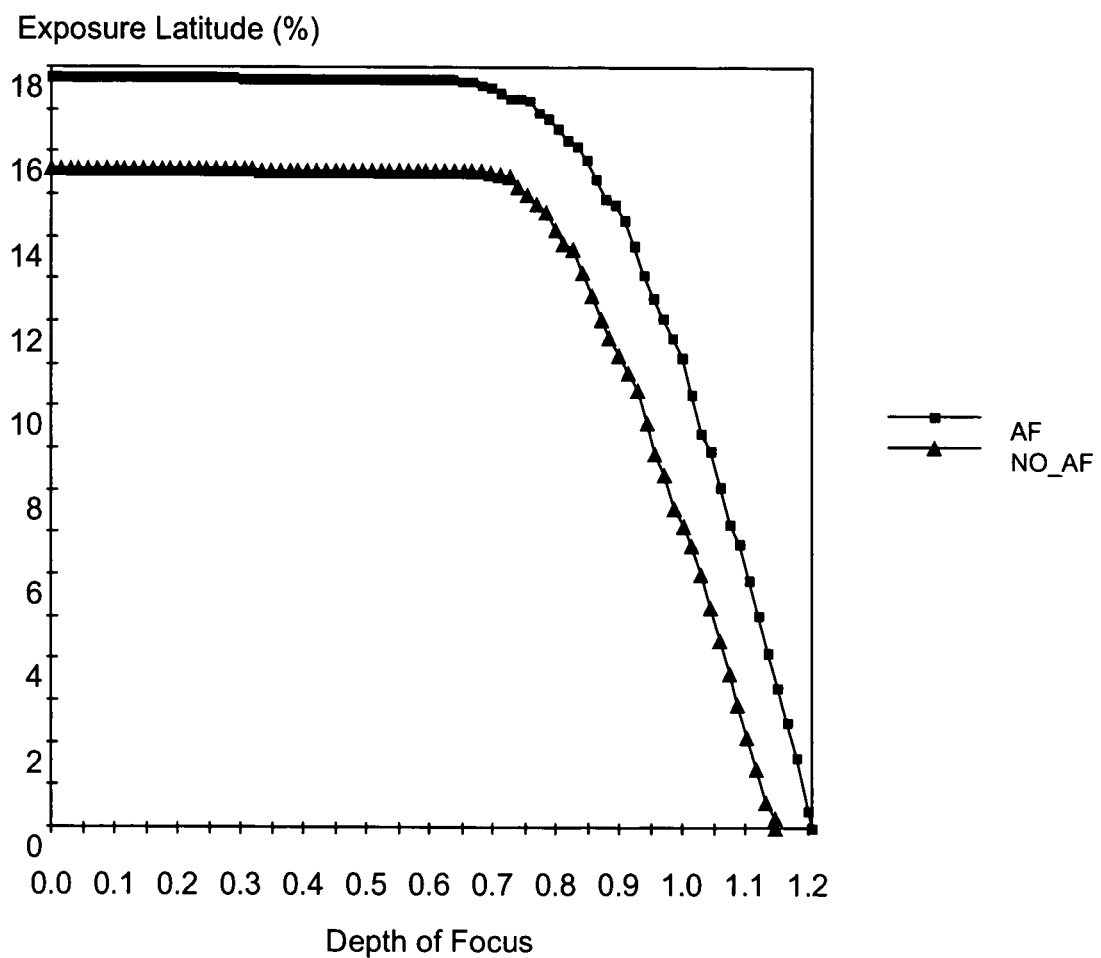
FIG. 12 is a graph of exposure latitude vs. depth of focus for a comparative example employing the mask of FIG. 8 and an embodiment of the invention employing the mask of FIG. 10.

In an example of an embodiment of the invention, the contact holes have a critical dimension of 130 nm and a pitch of 300 nm. The width of the assist features 73 is 15 nm (all dimensions are at substrate level). FIG. 12 is a graph of exposure latitude vs. depth of focus for this example (squares) and a comparative example with the same pattern of contact holes but no assist features (triangles). It will be seen that the assist features according to an embodiment of the invention provide an improvement in exposure latitude of about 2% over a wide range of depth of focus.

Figure 13:
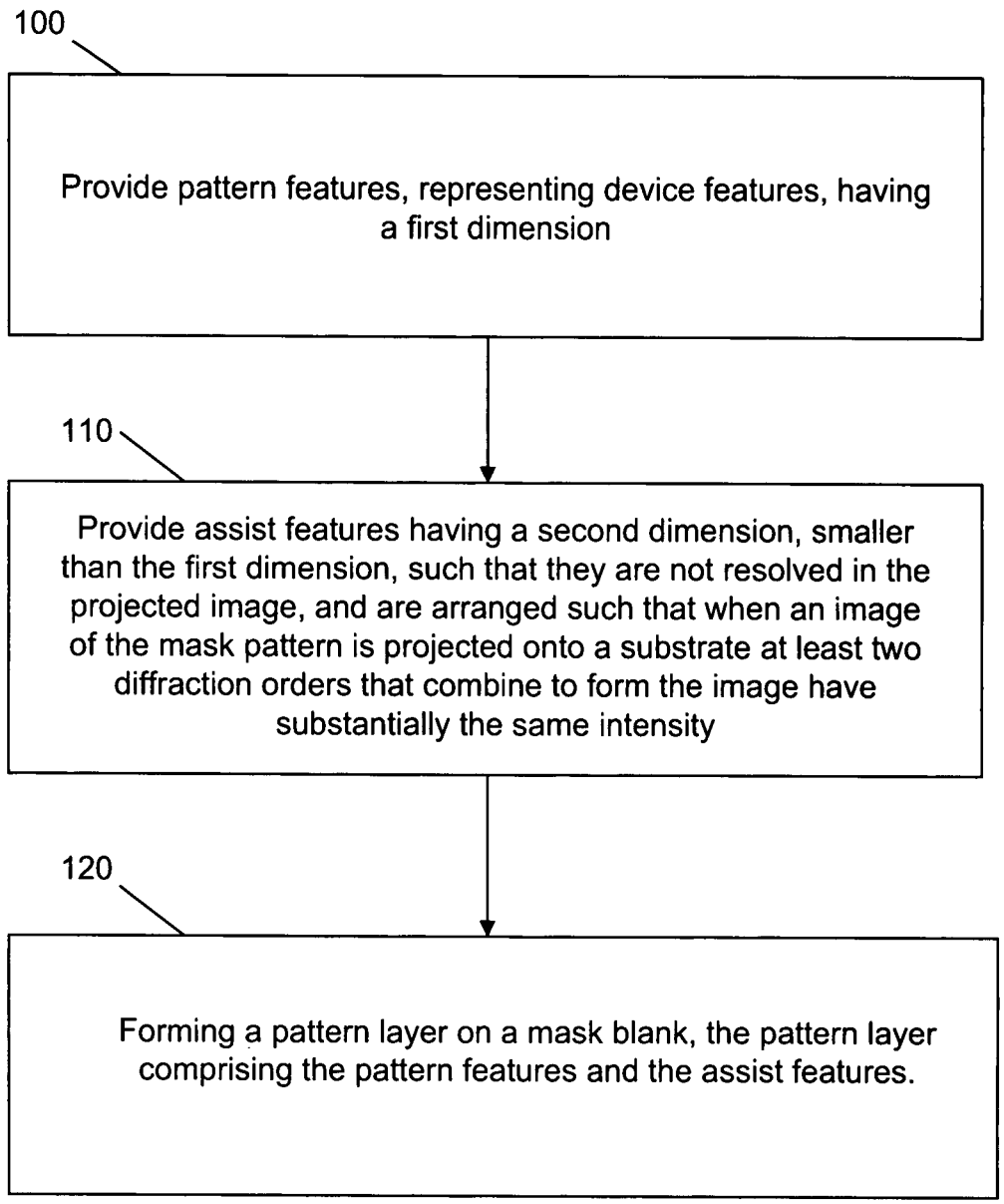
FIG. 13 depicts an example of a method of making a mask pattern for use in lithography according to an embodiment of the invention.

FIG. 13 shows an example of a method of making a mask pattern for use in lithography according to an embodiment of the invention. At step 100 pattern features having a first dimension representing device features to be formed by lithography are provided. At step 110 assist features having a second dimension are provided, the second dimension being sufficiently smaller than the first dimension such that the assist features are not resolved in the projected image, wherein the assist features are arranged such that when an image of the mask pattern is projected onto a substrate at least two diffraction orders that combine to form the image have substantially the same intensity. A method of determining such assist features is discussed above. At step 120, a pattern layer on a mask blank is formed, the pattern layer comprising the pattern features and the assist features.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A device manufacturing method comprising projecting an image of a mask pattern onto a substrate, wherein the mask pattern comprises pattern features having a first dimension and assist features having a second dimension, the second dimension being greater than 0% but less than or equal to 40% of the first dimension such that the assist features are not resolved in the projected image, the assist features are spaced apart from the pattern features, and the assist features are arranged such that at least two different diffraction orders that combine to form the projected image have substantially the same intensity when the at least two different diffraction orders would not otherwise have substantially the same intensity without the assist features.

2. A method according to claim 1, wherein the at least two diffraction orders have intensities that differ by not more than 20%.

3. A method according to claim 2, wherein the at least two diffraction orders have intensities that differ by not more than 10%.

4. A method according to claim 2, wherein the at least two diffraction orders have intensities that differ by not more than 5%.

5. A method according to claim 1, wherein the at least two diffraction orders comprise the zeroth order and one first order.

6. A method according to claim 1, wherein the at least two diffraction orders comprise the zeroth order and two first orders.

7. A method according to claim 1, wherein the at least two diffraction orders further comprise two first orders.

8. A method according to claim 1, wherein the mask pattern comprises a dark field and the pattern features and the assist features are bright.

9. A method according to claim 8, wherein the dark field has a transmissivity selected from the range of 5 to 20% and imparts a phase shift of substantially 180° or an odd multiple of 180°.

10. A method according to claim 1, wherein the pattern features comprise first lines and the assist features comprise second lines.

11. A method according to claim 10, wherein the first dimension is the width of the first lines and the second dimension is the width of the second lines.

12. A method according to claim 11, wherein the second dimension is selected from the range of 10% to 30% of the first dimension.

13. A method according to claim 1 wherein the pattern features comprise an array having rows and columns of contact holes and the assist features comprise lines substantially parallel to the rows and columns.

14. A method according to claim 13, wherein the first dimension is the critical dimension of the contact holes and the second dimension is the width of the second lines.

15. A method according to claim 14, wherein the second dimension is selected from the range of 2% to 20% of the first dimension.

16. A method of making a mask pattern for use in lithography, the method comprising:
providing pattern features having a first dimension representing device features to be formed by lithography; and
providing assist features having a second dimension, the second dimension being greater than 0% but less than or equal to 40% of the first dimension such that the assist features are not resolved in the projected image, wherein
the assist features are spaced apart from the pattern features, and
the assist features are arranged such that when an image of the mask pattern is projected onto a substrate at least two different diffraction orders that combine to form the image have substantially the same intensity when the at least two different diffraction orders would not otherwise have substantially the same intensity without the assist features.

17. A method according to claim 16, further comprising forming a pattern layer on a mask blank, the pattern layer comprising the pattern features and the assist features.

18. A method according to claim 16, wherein the at least two diffraction orders further comprise two first orders.

19. A device manufacturing method comprising:
projecting an image of a mask pattern, comprising pattern features and assist features, onto a layer of positive tone resist on a substrate,
wherein the pattern features and the assist features comprise bright features contrasting with a dark field, the assist features being lines arranged in one or two directions and positioned equidistantly between pairs of pattern features, and
the width of the assist features being selected such that the assist features are not resolved in the projected image and such that the peak intensities of at least two different diffraction orders forming the projected image are substantially equal.

20. A device manufacturing method according to claim 19, wherein the at least two diffraction orders further comprise two first orders.

* * * * *